United States Patent
Yang

(10) Patent No.: US 11,018,052 B2
(45) Date of Patent: May 25, 2021

(54) INTERCONNECT STRUCTURE AND METHOD OF FORMING THE SAME

(71) Applicant: Yangtze Memory Technologies Co., Ltd., Wuhan (CN)

(72) Inventor: Gang Yang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/691,827

(22) Filed: Nov. 22, 2019

(65) Prior Publication Data

US 2020/0411369 A1 Dec. 31, 2020

Related U.S. Application Data

(63) Continuation of application No. PCT/CN2019/093170, filed on Jun. 27, 2019.

(51) Int. Cl.
*H01L 21/768* (2006.01)
*H01L 21/027* (2006.01)
(Continued)

(52) U.S. Cl.
CPC .... *H01L 21/76816* (2013.01); *H01L 21/0273* (2013.01); *H01L 21/0332* (2013.01);
(Continued)

(58) Field of Classification Search
None
See application file for complete search history.

(56) References Cited

U.S. PATENT DOCUMENTS 6,077,733 A 6/2000 Chen et al.
6,787,452 B2 9/2004 Sudijono et al.
(Continued)

FOREIGN PATENT DOCUMENTS

CN 107689319 A 2/2018
CN 109585364 A 4/2019
(Continued)

OTHER PUBLICATIONS

Combined Chinese Office Action and Search Report dated Apr. 3, 2020 in corresponding Chinese Patent Application No. 201980001307.4 (with English Translation of Category of Cited Documents), 5 pages.

(Continued)

*Primary Examiner* — Evren Seven
(74) *Attorney, Agent, or Firm* — Oblon, McClelland, Maier & Neustadt, L.L.P.

(57) ABSTRACT

A method for fabricating a semiconductor device that includes forming a mask stack over a semiconductor structure. The mask stack has a first mask layer and a second mask layer, where the second mask layer is arranged between the first mask layer and the semiconductor structure. The method further includes patterning a first pattern in the mask stack. The first pattern includes a first opening having first sidewalls formed in the first mask layer, a second opening having second sidewalls formed in the second mask layer, and a third opening having third sidewalls formed in the semiconductor structure. The first, second, and third sidewalls of the respective openings of the first pattern are formed around a central axis, where the second sidewalls of the second opening are located further away from the central axis than both the first and third sidewalls of the first and third openings, respectively.

20 Claims, 12 Drawing Sheets

(51) Int. Cl.
  *H01L 21/033* (2006.01)
  *H01L 21/311* (2006.01)
  *H01L 23/522* (2006.01)
  *H01L 23/528* (2006.01)

(52) U.S. Cl.
  CPC ...... *H01L 21/0334* (2013.01); *H01L 21/0337* (2013.01); *H01L 21/0338* (2013.01); *H01L 21/31116* (2013.01); *H01L 21/31144* (2013.01); *H01L 21/76804* (2013.01); *H01L 21/76811* (2013.01); *H01L 21/76831* (2013.01); *H01L 21/76843* (2013.01); *H01L 21/76877* (2013.01); *H01L 23/5226* (2013.01); *H01L 23/5283* (2013.01)

(56) References Cited

U.S. PATENT DOCUMENTS

| | | | |
|---|---|---|---|
| 7,129,159 B2 | 10/2006 | America et al. | |
| 7,828,987 B2 | 11/2010 | Schneider et al. | |
| 10,115,628 B2* | 10/2018 | Peng | H01L 21/7684 |
| 2001/0029105 A1 | 10/2001 | Seta et al. | |
| 2006/0046495 A1* | 3/2006 | Frohberg | H01L 21/76804 |
| | | | 438/706 |
| 2011/0294297 A1* | 12/2011 | Sukekawa | H01L 21/76816 |
| | | | 438/703 |
| 2017/0140982 A1* | 5/2017 | Tien | H01L 21/31111 |
| 2019/0103281 A1* | 4/2019 | Chen | H01L 21/31144 |
| 2020/0083093 A1* | 3/2020 | Liu | H01L 21/76813 |

FOREIGN PATENT DOCUMENTS

| | | |
|---|---|---|
| TW | 471126 | 1/2002 |
| TW | 200924055 | 6/2009 |
| TW | I581326 B | 5/2017 |
| TW | I581348 B | 5/2017 |

OTHER PUBLICATIONS

International Search Report and Written Opinion dated Mar. 30, 2020 in PCT/CN2019/093170, 9 pages.

Combined Chinese Office Action and Search Report dated Jan. 13, 2020 in Chinese Patent Application No. 201980001307.4 (with English translation of Category of Cited Documents), 8 pages.

Combined Chinese Office Action and Search Report dated Oct. 20, 2020 in corresponding Chinese Patent Application No. 202010502933.6 (with English Translation of Category of Cited Documents), 11 pages.

* cited by examiner

INTERCONNECT STRUCTURE AND METHOD OF FORMING THE SAME

RELATED APPLICATION

This application is a bypass continuation of International Application No. PCT/CN2019/093170, filed on Jun. 27, 2019. The entire disclosure of the prior application is hereby incorporated by reference in its entirety.

BACKGROUND

Semiconductor devices are widely used in various electronic equipment, such as smart phones, laptops, digital cameras, and other equipment. In general, a typical semiconductor device includes a substrate having active devices such as transistors, capacitors, inductors and other components. These active devices are initially isolated from each other, and interconnect structures are subsequently formed over the active devices to create functional circuits. Such interconnect structures may include lateral interconnections, such as conductive lines or wirings, and vertical interconnections, such as conductive vias or contact plugs.

There is an ever increasing demand for smaller and faster semiconductor devices which are simultaneously able to support a greater number of increasingly complex and sophisticated functions. This scaling down process generally provides benefits by increasing production efficiency and lowering associated costs. Nevertheless, such scaling down has also increased the complexity of processing and manufacturing of the semiconductor devices. As dimensions of semiconductor devices scale to smaller sub-micron sizes in advanced technology nodes, it becomes an increasing challenge to produce an interconnect structure that has a sufficient critical dimension (CD) difference between a top CD of the conductive line (or conductive trench) and a bottom CD of the conductive via in the interconnect structure.

SUMMARY

The inventive concepts relate to a novel etching process to produce an interconnect structure, such as a dual damascene structure, that includes a conductive trench and a conductive via. The conductive trench can have a top critical dimension (CD) and the conductive via can be positioned below the conductive trench and have a bottom CD. In a related etching process, it can be difficult to produce an interconnect structure that has a sufficient CD difference between a top CD and a bottom CD of the interconnect structure to meet design requirements. For example, in the related etching process, a mask layer can be formed over a semiconductor structure with an opening formed inside. In order to obtain a desired top CD value, a trim process can be applied to expand the opening in the mask layer, and the expanded opening can be transferred into the semiconductor structure to form a trench opening by a subsequent etching process. However, the trim process can also reduce a thickness of the mask layer, which results in insufficient protection during the subsequent etching process.

In present disclosure, a novel method is introduced to produce the dual damascene structure that has a sufficient CD difference between the bottom CD associated with the conductive via and the top CD associated with the conductive trench, according to circuit designs. In the present disclosure, a first mask layer can be formed over a semiconductor structure, and a second mask layer can be disposed between the first mask layer and the semiconductor structure. A pattern can be formed that includes a first opening formed in the first mask layer, a second opening formed in the second mask layer, and a third opening formed in the semiconductor. A trim process can be applied to expand the second opening in the second mask layer by using the first mask layer as a protection layer. Accordingly, an expanded opening can be obtained in the second mask layer while a height of the second mask layer is maintained due to the protection of the first mask layer. The expanded opening is subsequently transferred into the semiconductor structure to form a trench opening with a desired CD by applying an etching process. In addition, the maintained height of the second mask layer can provide sufficient during the etching process.

According to an aspect of the disclosure, a method for fabricating a semiconductor device is disclosed where a mask stack is formed over a semiconductor structure. The mask stack includes a first mask layer and a second mask layer that is arranged between the first mask layer and the semiconductor structure. A first pattern is subsequently patterned in the mask stack that includes a first opening having first sidewalls formed in the first mask layer, a second opening having second sidewalls formed in the second mask layer, and a third opening having third sidewalls formed in the semiconductor structure. In the first pattern, the first, second, and third sidewalls of the respective openings are formed around a central axis. The second sidewalls of the second opening are located further away from the central axis than both the first and third sidewalls of the first and third openings, respectively.

In some embodiments, the mask stack further includes a resist layer formed over the first mask layer. In the disclosed method, a second pattern is patterned in the resist layer. A first etching process is then performed to transfer the second pattern into the first mask layer, the second mask layer, and the semiconductor structure so as to form a third pattern that extends into the semiconductor structure. Further, a first trim process is performed to remove the resist layer and a portion of the second mask layer, so as to form the second opening of the first pattern.

The first mask layer can be removed and a second trim process can be performed to recess the second mask layer so as to form a fourth pattern. The fourth pattern includes a fourth opening formed in the second mask layer and a fifth opening formed in the semiconductor structure. A second etching process is then performed according to the fourth pattern to form an interconnect opening that includes a trench opening and a via opening.

In alternative embodiments, the first mask layer can be removed by an etching process. The etching process further etches the sidewalls of the second opening and the third opening. In some embodiments, a critical dimension (CD) of the second opening is larger than a CD of the first opening and a CD of the third opening.

In embodiments, the third opening can have a tapered profile. A critical dimension of the fourth opening is larger than a critical dimension of the second opening after performing the second trim process to recess the second mask layer.

The semiconductor structure can further include a to-be-connected region that is disposed on the central axis, a barrier layer formed over the to-be-connected region, and a plurality of dielectric layers formed over the barrier layer.

In some embodiments, during the second etching process, an exposed area that is not covered by the second mask in the semiconductor structure is etched to form the trench opening with a top critical dimension. Sidewalls and a bottom of the fifth opening are also etched by the second etching process to form the via opening that exposes the to-be-connected region. The via opening has a bottom critical dimension that is smaller than the top critical dimension.

According to another aspect of the disclosure, a method for fabricating a semiconductor device is provided where a mask stack is formed over a semiconductor structure. The mask stack includes a first pattern formed in a resist layer, a first mask layer formed below the resist layer, and a second mask layer formed disposed between the first mask layer and the semiconductor structure. A first etching process is then performed. The first etching process etches the semiconductor structure according to the first pattern to transfer the first pattern into the first mask layer, the second mask layer, and the semiconductor structure so as to form a second pattern. The second pattern has sidewalls that extend into the semiconductor structure.

In the disclosed method, a first trim process can be subsequently performed that removes the resist layer and a portion of the second mask layer to form a third pattern. The third pattern has a first opening having first sidewalls formed in the first mask layer, a second opening having second sidewalls formed in the second mask layer, and a third opening having third sidewalls formed in the semiconductor structure. Moreover, the first, second, and third sidewalls of the respective openings are formed around a central axis, and the second sidewalls of the second opening are located further away from the central axis than both the first and third sidewalls of the first and third openings, respectively.

Further, the first mask layer is removed and a second trim process is performed to recess the second mask so as to form a fourth pattern. The fourth pattern includes a fourth opening formed in the second mask layer and a fifth opening extending into the semiconductor structure. A second etching process is subsequently performed according to the fourth pattern to transfer the fourth pattern into the semiconductor structure so as to form an interconnect opening. The interconnect opening includes a trench opening and a via opening.

According to yet another aspect of the disclosure, a method for fabricating a semiconductor device can be provided where a semiconductor structure is formed. The semiconductor structure includes a to-be-connected region that is disposed on a central axis, a barrier layer formed over the to-be-connected region, and a plurality of dielectric layers formed over the barrier layer. A mask stack is further formed over the semiconductor structure. The mask stack includes a first mask layer and a second mask layer that is arranged between the first mask layer and the semiconductor structure. A first pattern is subsequently formed in the mask stack. The first pattern includes a first opening having first sidewalls formed in the first mask layer, a second opening having second sidewalls formed in the second mask layer, and a third opening having third sidewalls formed in the plurality of the dielectric layer of the semiconductor structure and a bottom disposed over the barrier layer. The first, second, and third sidewalls of the respective openings are arranged around the central axis and a critical dimension of the second opening is greater than critical dimensions of both the first and third openings, respectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
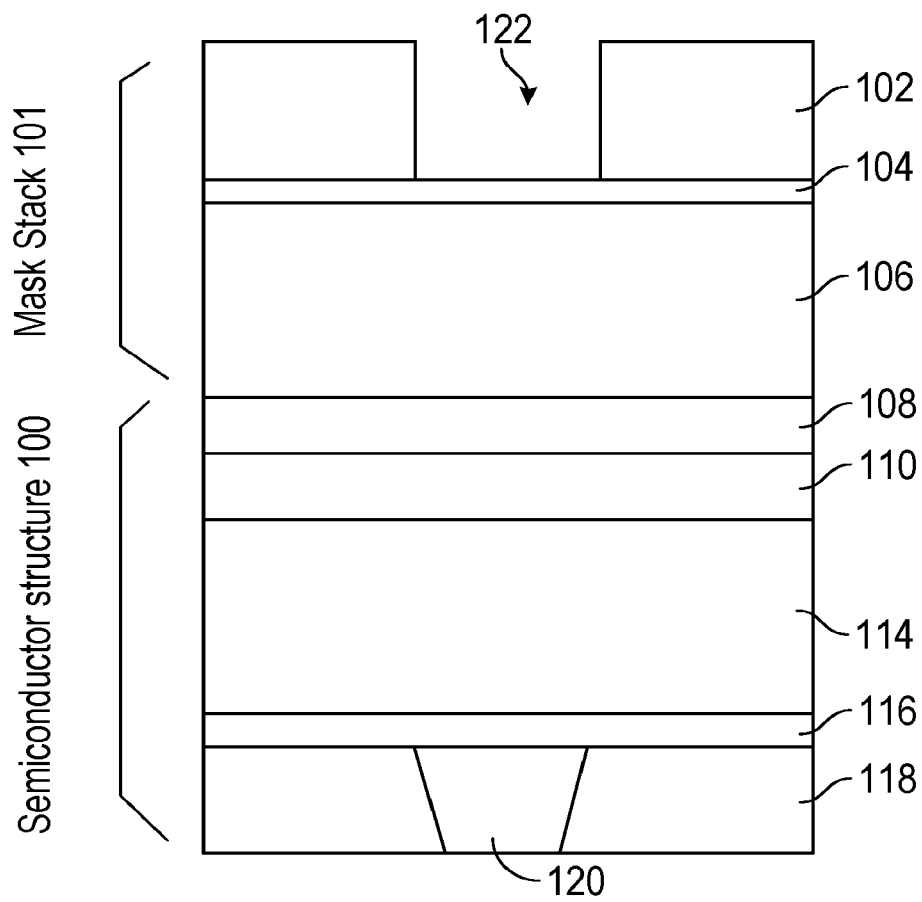
FIGS. 1A through 1D are related examples showing various cross-sectional views of intermediate steps of manufacturing a structure, such as dual damascene structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a technique for forming a mask profile for damascene structures. The technique includes two trim processes, such as a protected trim process and a regular trim process. The protected trim process trims a mask layer in the lateral direction with the vertical direction trim-prevented by a protection layer, and the regular trim process trims the mask layer in both lateral direction and the vertical direction (with same or different trim rate). Comparing with related examples that use only regular trim process, the two trim processes can increase the top openings of the dual damascene structures in the lateral direction without using thick mask layer. Thus, the technique of the two trim processes can be used to reduce resistance of the dual damascene structures without consuming excess mask layer material.

FIGS. 1A through 1D show cross-sectional views of intermediate steps of a related example that manufactures a structure, such as dual damascene structure using a regular trim process. FIG. 1A shows a cross-sectional view of a semiconductor structure 100 having a to-be-connected region 120 formed in a first dielectric layer 118. The to-be-connected region 120 can be a contact, a gate, a source region, a drain region, a lower level metal line structures, or the like. As shown, a barrier layer 116 is formed over the to-be-connected region 120. Additionally, a second dielectric layer 114 is formed over the barrier layer 116, a third dielectric layer 110 is formed over the second dielectric layer 114, and a fourth dielectric layer 108 is formed over the third dielectric layer 110. Of course, the semiconductor structure 100 is merely an example, and the structure can have other films or components, such as additional contacts, dielectric layers, and the like.

As shown in FIG. 1A, a mask stack 101 is formed over the semiconductor structure 100. The mask stack 101 includes a mask layer 106, such as an amorphous carbon layer, a dielectric anti-reflective coating (DARC) 104, such as a SiON layer, and a photoresist layer 102. In other embodiments, additional layers can also be included in the mask stack 101. For example, a bottom anti-reflective coating (BARC) layer can be positioned between the photoresist layer 102 and the DARC 104.

A pattern 122 can be formed in the photoresist layer 102. The pattern 122 can be formed according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 1B:
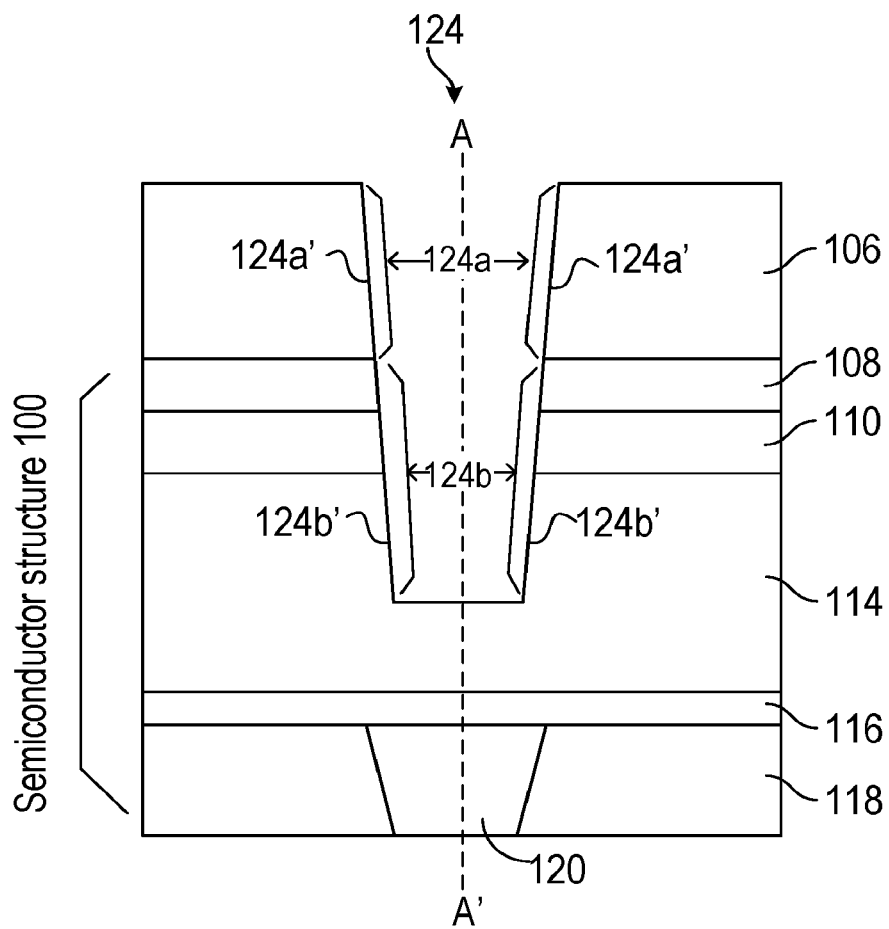

FIG. 1B shows a via etching process that can transfer the pattern 122 into the carbon layer 106, and further into the fourth dielectric layer 108, the third dielectric layer 110, and the second dielectric layer 114 so as to form an opening 124. The opening 124 can have a first sub-opening 124a formed in the carbon layer 106, and a second sub-opening 124b formed in the semiconductor structure 100. The first sub-opening 124a can have sidewalls 124a' and the second sub-opening 124b can have sidewalls 124b'. The first sub-opening 124a and the second sub-opening 124b can be disposed around a central axis A-A'. It should be noted that the DARC 104 can be consumed after the via etching process.

Figure 1C:
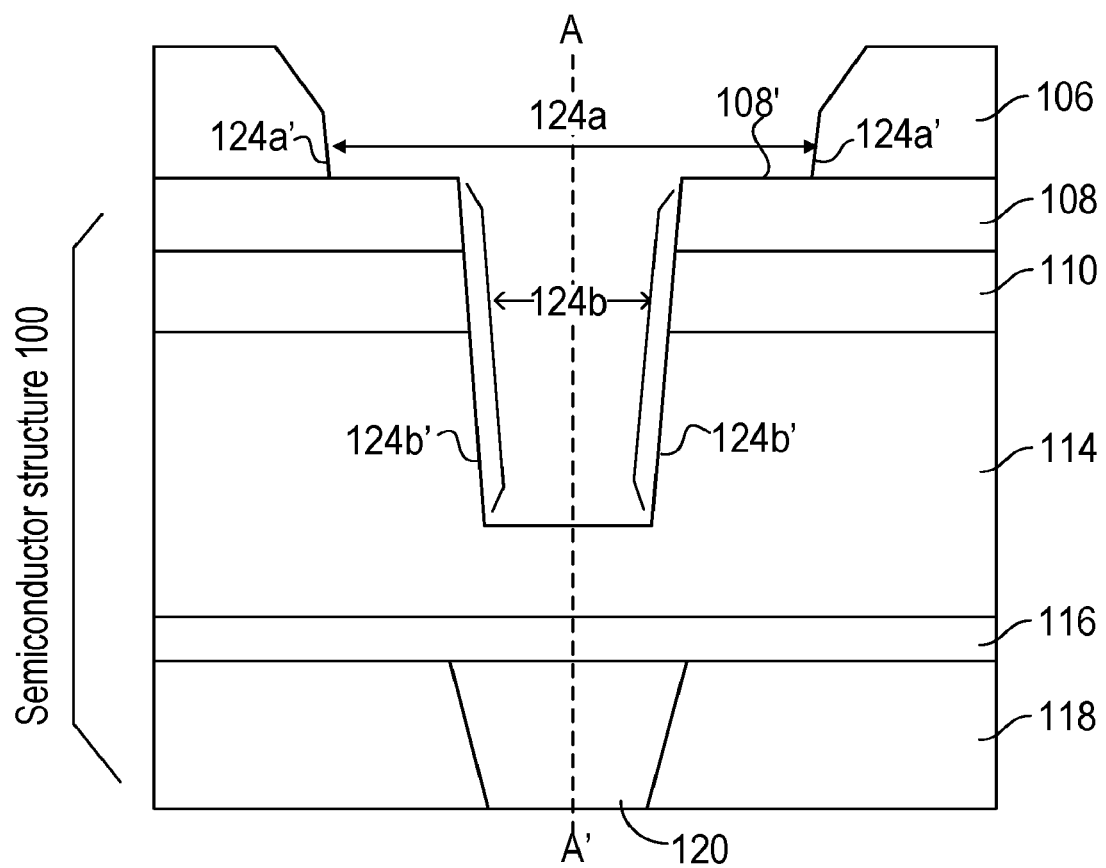

FIG. 1C show a trim process that can be applied to recess the carbon layer 106, where the carbon layer 106 can be recessed along a vertical direction that is perpendicular to a top surface 108' of the fourth dielectric layer 108 and a horizontal direction that is parallel to the top surface 108' of the fourth dielectric layer 108. Accordingly, the first sub-opening 124a formed in the carbon layer 106 can be expanded along the horizontal direction to expose a portion of the fourth dielectric layer 108. Comparing FIG. 1B and FIG. 1C, after the trim process the sidewalls 124a' of the first sub-opening 124a are located further away from the central axis A-A'. In addition, a thickness of the carbon layer 106 is also reduced as a result of the trim process along the vertical direction. In some embodiments, the trim process can be a plasma treatment by using gases, such as $O_2$, $N_2$, $H_2$, and Ar. Accordingly, the second sub-opening 124b is not affected by the trim process. As shown in FIGS. 1B and 1C, the sidewalls 124b' of the second sub-opening 124b remain located at a same position from the central axis A-A'.

Figure 1D:
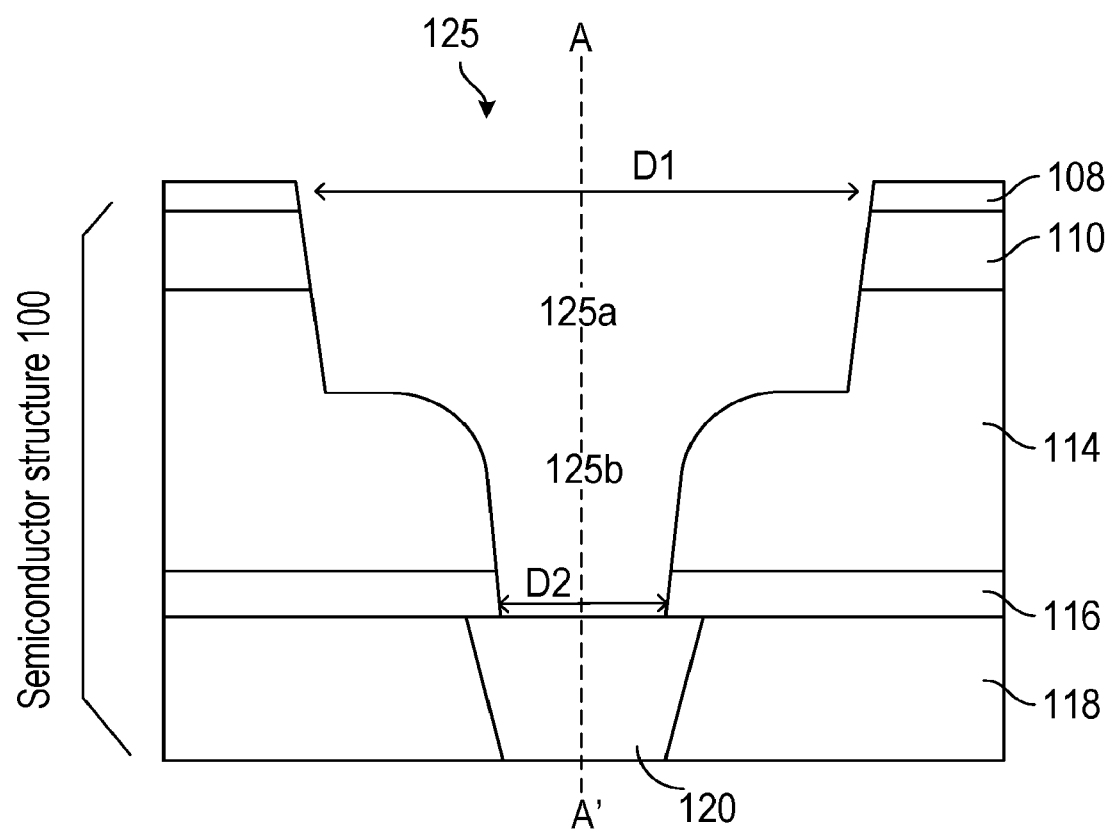

In FIG. 1D, a trench etching process can be applied to etch the semiconductor structure 100. After the trench etching process, a dual damascene opening 125 that includes a trench opening 125a and a via opening 125b can be formed. The trench etching process removes portions of the fourth dielectric layer 108, the third dielectric layer 110, and the second dielectric layer 114 that are exposed by the first sub-opening 124a so as to form the trench opening 125a. The trench opening 125a can have a top CD that is equal to D1. The trench etching process can also expand the second sub-opening 124b along the vertical direction and the horizontal direction to form the via opening 125b. As show in FIG. 1D, after the trench etching process, the second sub-opening 124b can extend through the second dielectric layer 114 and the barrier layer 116 to expose the to-be-connected region 120. The sub-opening 124b can also be expanded in the second dielectric layer 114 along the horizontal direction. The via opening 125b can have a bottom CD equal to D2 that is smaller than the top CD D1. The dual damascene opening 125 can be filled in conductive material to form a dual damascene structure in subsequent processes.

As mentioned above, in some embodiments, a sufficient CD difference between the top CD and the bottom CD of the dual damascene structure is required. The top CD of the trench opening are required to meet a first target value (e.g., to be larger than the first target value) to reduce the resistance of the dual damascene structure, and the bottom CD of the via opening are controlled within a second target value to prevent electrical shorts between the via and adjacent to-be-connected regions or to prevent the via falling off from underlying to-be-connected regions, such as the to-be-connected region 120. In order to obtain a desired top CD of the trench opening, the trim process described above in FIG. 1C is required to recess the carbon layer 106 horizontally to a target value so as to provide a sufficient exposure of the underlying layers (i.e., the fourth dielectric layer 108, the third dielectric layer 110). However, the carbon layer can be also recessed vertically by the trim process, which results in a thickness reduction of the carbon layer. The reduced thickness of the carbon layer can reduce a process window of the trench etching process because the carbon layer may not provide a sufficient protection to the unexposed semiconductor structure during the followed etching process.

Figure 2:
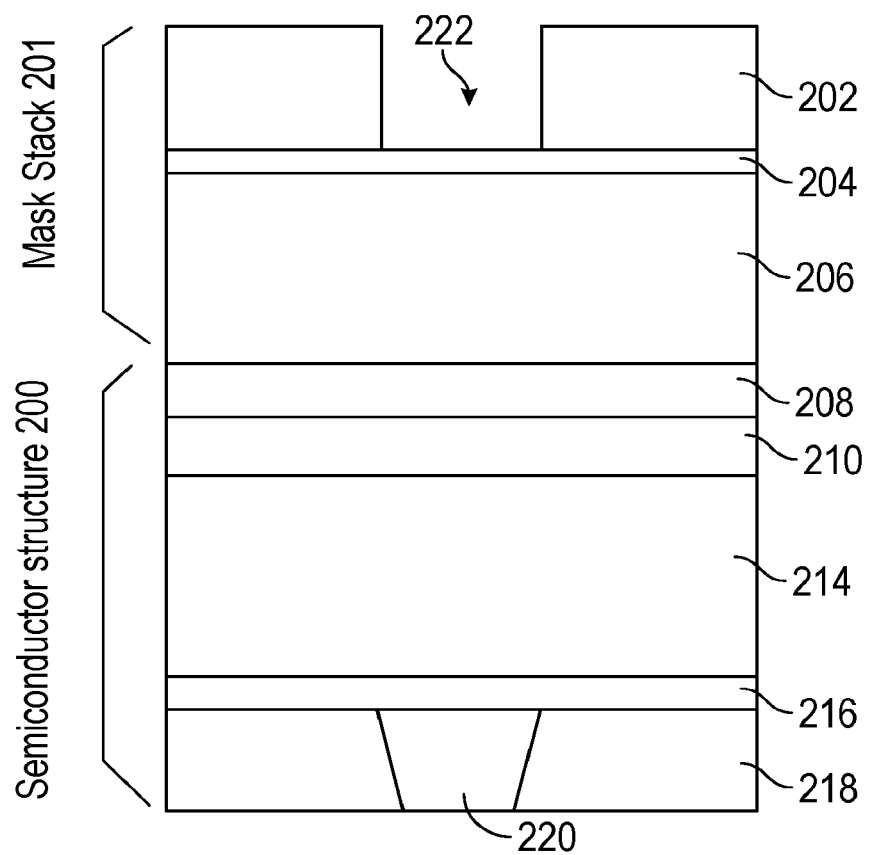
FIGS. 2 through 8 are cross-sectional and top-down views of various intermediary steps of manufacturing an interconnect structure, such as a dual damascene structure, in a disclosed method, in accordance with exemplary embodiments of the disclosure.

FIGS. 2 through 8 are cross-sectional views of various intermediate steps of manufacturing a dual damascene structure in accordance with aspects of this disclosure. FIG. 2 shows a semiconductor structure 200 that has a similar configuration to the semiconductor structure 100. As shown, the semiconductor structure 200 has a to-be-connected region 220 formed in a first dielectric layer 218, a barrier layer 216 formed over the first dielectric layer 218 and the to-be-connected region 220, a second dielectric layer 214 positioned over the barrier layer 216, a third dielectric layer 210 formed over the second dielectric layer 214, and a fourth dielectric layer 208 formed over the third dielectric layer 210. Of course, the structure shown in FIG. 2 is merely an example, and the semiconductor structure 200 can include additional layers or additional components. For example, the semiconductor structure 200 can include other contact structures, gate regions, source regions, drain regions, and the like. The semiconductor structure 200 can also include other film layers based on the technology requirements.

A mask stack 201 is arranged over the fourth dielectric layer 208 of the semiconductor structure 200. Similar to FIG. 1, the mask stack 201 can include a first mask layer 206, such as a carbon layer, a second mask layer 204, such as a DARC layer, and a photoresist layer 202. A first pattern 222 is formed in the photoresist layer 202 according to any suitable technique, such as a lithography process. Of course, FIG. 2 is merely an example and the mask stack can include additional layers, such as a bottom anti-reflective coating (BARC), a hard mask layer, and the like.

In the exemplary embodiment of FIG. 2, the to-be-connected region 220 can be a lower layer metal line structure made of Cu. It is noted that the to-be-connected region 220 can be other suitable conductive region, such as source contact structure, drain contact structure, gate contact structure, and the like. The barrier layer 216 can be a TiN with a thickness from 400 Å to 600 Å. The second dielectric layer 214 can be a SiO layer with a thickness from 2500 Å to 5000 Å. The third dielectric layer 210 can be a NDC layer with a thickness from 700 Å to 1000 Å. The fourth dielectric layer 208 can be a SiO layer with a thickness from 700 Å to 1000 Å. The carbon layer 206 can have a thickness ranged from 3000 Å to 5000 Å. The DARC layer 204 can have a thickness from 300 Å to 500 Å, and photoresist layer 202 can have a thickness from 2500 Å to 3500 Å. Additionally, the first pattern 222 can have a CD between 50 nm and 200 nm based on circuit designs.

Figure 3:
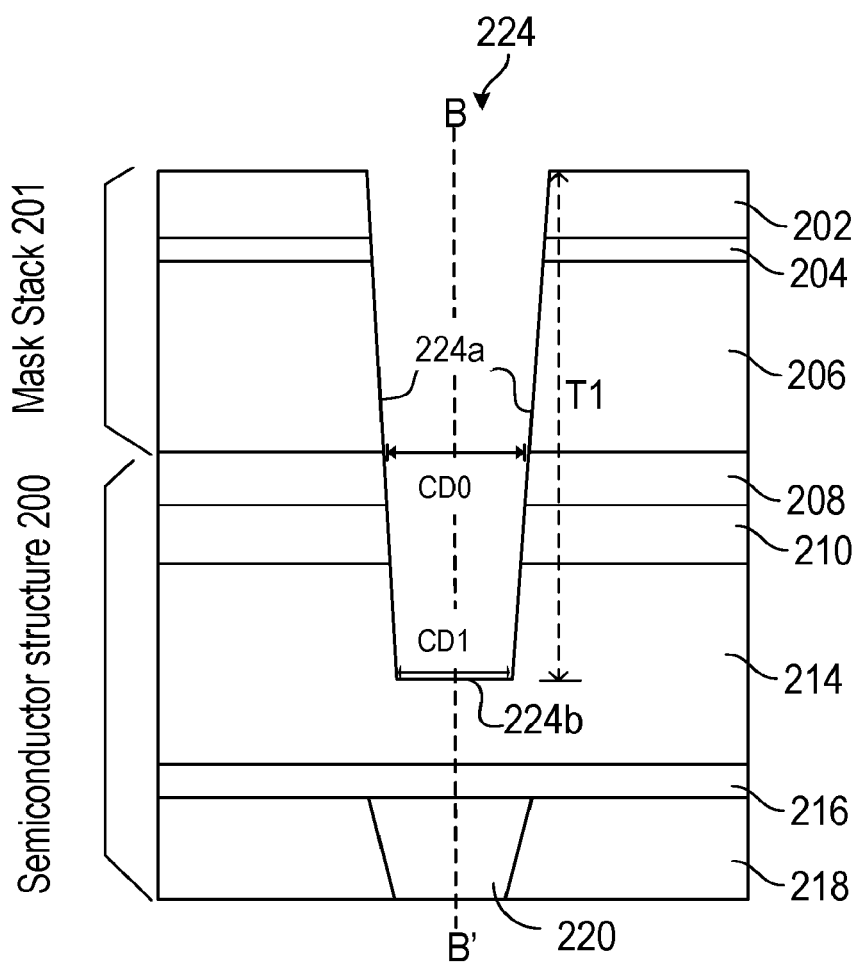

In FIG. 3, a first etching process can be applied. The first etching process can etch the semiconductor structure 200 and mask stack 201 according to the first pattern 222 to transfer the first pattern 222 into the DARC layer 204, the carbon layer 206, and further extend into the semiconductor structure 200 to form a second pattern 224 positioned around a central axis B-B'. For example, as shown in FIG. 2, the second pattern 224 can pass through the fourth dielectric layer 208, the third dielectric layer 210, and extend into the second dielectric layer 214. The second pattern 224 can have sidewalls 224a and a bottom 224b that extends into the second dielectric layer 214 and are positioned over the barrier layer 216. As shown, the to-be-connected region 220 can also be located on the central axis B-B'.

In some embodiments, the first etching process can use etching gases, such as O2, CF4, CHF3, or the like. The first etching process can be operated at a temperature from 15° C. to 60° C., a pressure between 20 Torr and 80 Torr, a source power between 600 W and 1000 W, and a bias power between 0 W and 400 W. The first etching process can be an inductively coupled plasma (ICP) etching, a capacitively coupled plasma (CCP) etching, a reactive ion etching (RIE), or the like. In some embodiments, the second pattern 224 can have a depth T1 between 1000 nm to 3000 nm, have a CD1 ranging from 70 nm to 110 nm at the bottom 224b of the second pattern 224, and have a CD0 between 100 nm and 140 nm in the fourth dielectric layer 208.

Figure 4A:
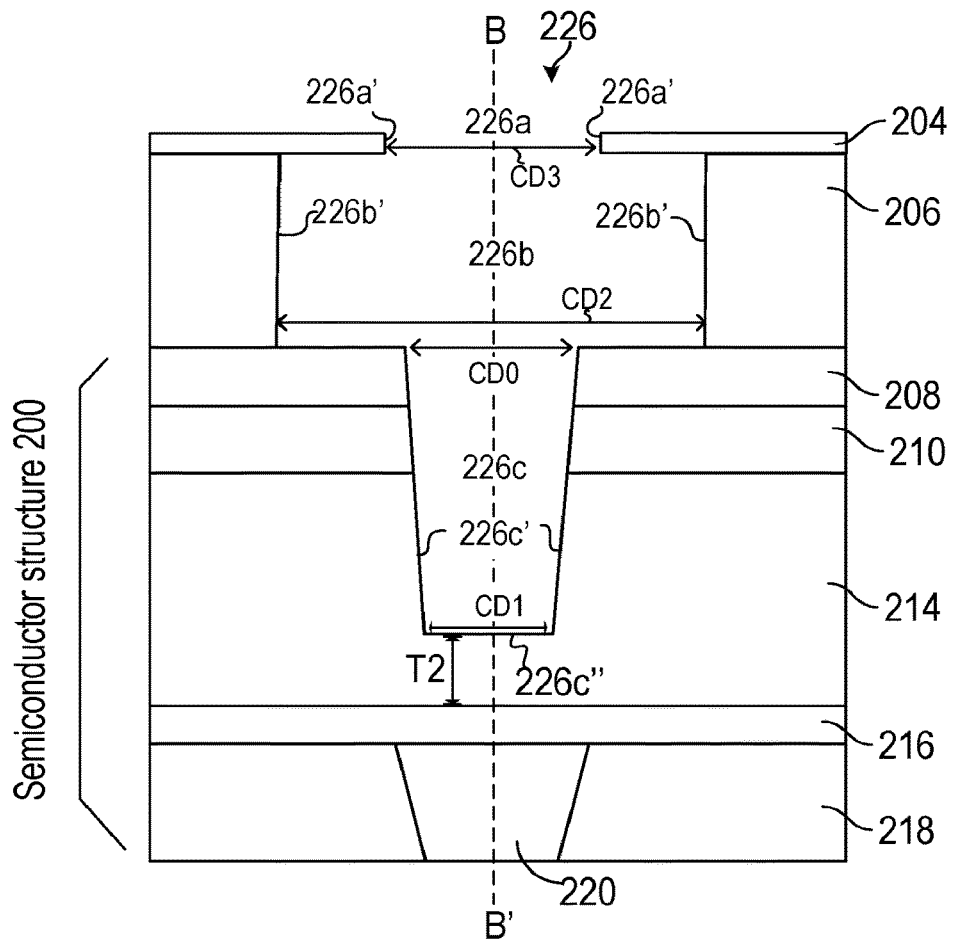

In FIG. 4A, a first trim process step can be applied. The first trim process step can remove the photoresist layer 202, and further recess or undercut a portion of the carbon layer 206 in the lateral direction (e.g., horizontal direction that is parallel to wafer surface) to form a third pattern 226. The third pattern 226 can include a first opening 226a formed in the DARC layer 204, a second opening 226b formed in the carbon layer 206, and a third opening 226c formed in the semiconductor structure and having a tapered profile. As shown in FIG. 4A, the third opening 226c can pass through the fourth dielectric layer 208, the third dielectric layer 210, and extend into the second dielectric layer 214 to form a bottom 226c". The bottom 226c" can be positioned over the barrier layer 216 with a depth of T2.

Still referring to FIG. 4A, the first opening 226a can have first sidewalls 226a', the second opening 226b can have second sidewalls 226b', and the third opening 226c can have third sidewalls 226c'. As shown, the second sidewalls 226b' of second opening 226b are located further away from the central axis B-B' than both the first sidewalls 226a' of the first opening 226a and the third sidewalls 226c' of the third opening 226c. In some embodiments, the first opening 226a can have a CD3 between 130 nm and 170 nm. The second opening 226b can have a CD2 between 200 nm and 240 nm. The third opening 226c can have a same dimension as the part of the second pattern 224 that is located in the semiconductor structure 200. Accordingly, a CD of the third opening 226c at the fourth dielectric layer 208 can be equal to CD0 and a CD of the third opening at the bottom 226c" can be equal to CD1.

Figure 4B:
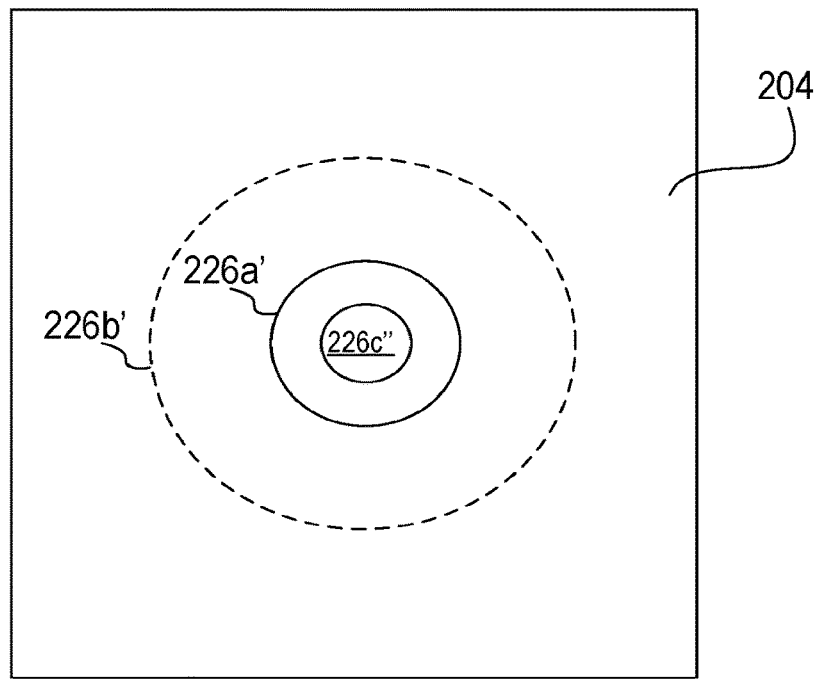

FIG. 4B is a top down view of the semiconductor structure 200 after the first trim process. The first opening 226a and the second 226b can have a generally circular shape. As shown in FIG. 4B, the second sidewalls 226b' of the second opening 226b are located further away from the central axis B-B' than both the first sidewalls 226a' and third sidewalls 226c of the first and third openings, respectively. It should be mentioned that, while shown as generally circular in shape, the first opening 226a, second opening 226b, and third opening 226c can have other shapes such as a square, triangular, or any other suitable shape based on the technology requirements.

In some embodiments, the first trim process can be a plasma treatment by using gases, such as $O_2$, $N_2$, $H_2$, Ar, or the like. The first trim process can be operated at a temperature between 10° C. and 80° C., at a pressure between 60 Torr and 80 Torr and at a source power between 500 W and 1200 W. The first trim process can be operated with the same equipment as the first etching process.

Figure 5:
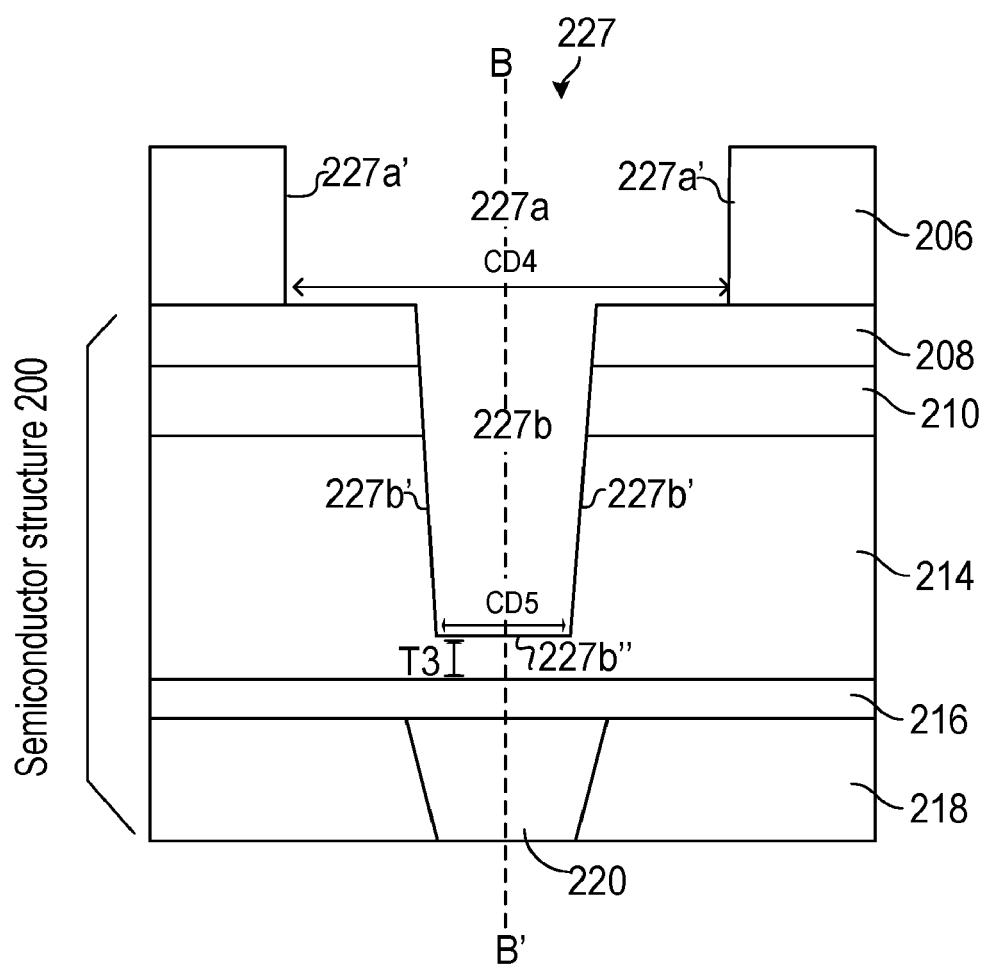

In FIG. 5, a breakthrough process can be applied to remove the DARC layer 204. After the break through process, a pattern 227 can be formed. The pattern 227 can have a top opening 227a formed in the carbon layer 206 and a bottom opening 227b formed in the semiconductor structure 200. The top opening 227a can have sidewalls 227a' and a CD equal to CD4. The bottom opening 227b can have sidewalls 227b' and a bottom 227b" with a CD equal to CD5. A distance between the bottom 227b" and the barrier layer 216 is T3. Comparing the third pattern 226 of FIG. 4A with the pattern 227 of FIG. 5, it can be seen that the breakthrough process can expand the second opening 226b in the third pattern 226 to form the top opening 227a. Accordingly, the CD4 of the top opening 227a is larger than the CD2 of the second opening 226b that is shown in FIG. 4A. The breakthrough process can further etch the third sidewalls 226c' and the bottom 226c" of the third opening 226c to form the bottom opening 227b. Comparing the third opening 226c shown in FIG. 4A and the bottom opening 227b, the bottom 227b" of the bottom opening 227b extends deeper into the second dielectric layer 214. Accordingly, the T3 is smaller than the T2 that is shown in FIG. 4A. In some embodiments, the T3 can be smaller than the T2 in a range between 400 Å to 600 Å.

In some embodiments, the breakthrough process can be a plasma etching process similar to the first etching process. For example, the breakthrough process can use similar etching gases, temperature, pressure, source power, bias power, and equipment to the first etching process. However, comparing to the first etching process, the breakthrough process has a shorter process time. In some embodiments, the process time of the breakthrough process is in a range from 5 sec to 30 sec.

Figure 6:
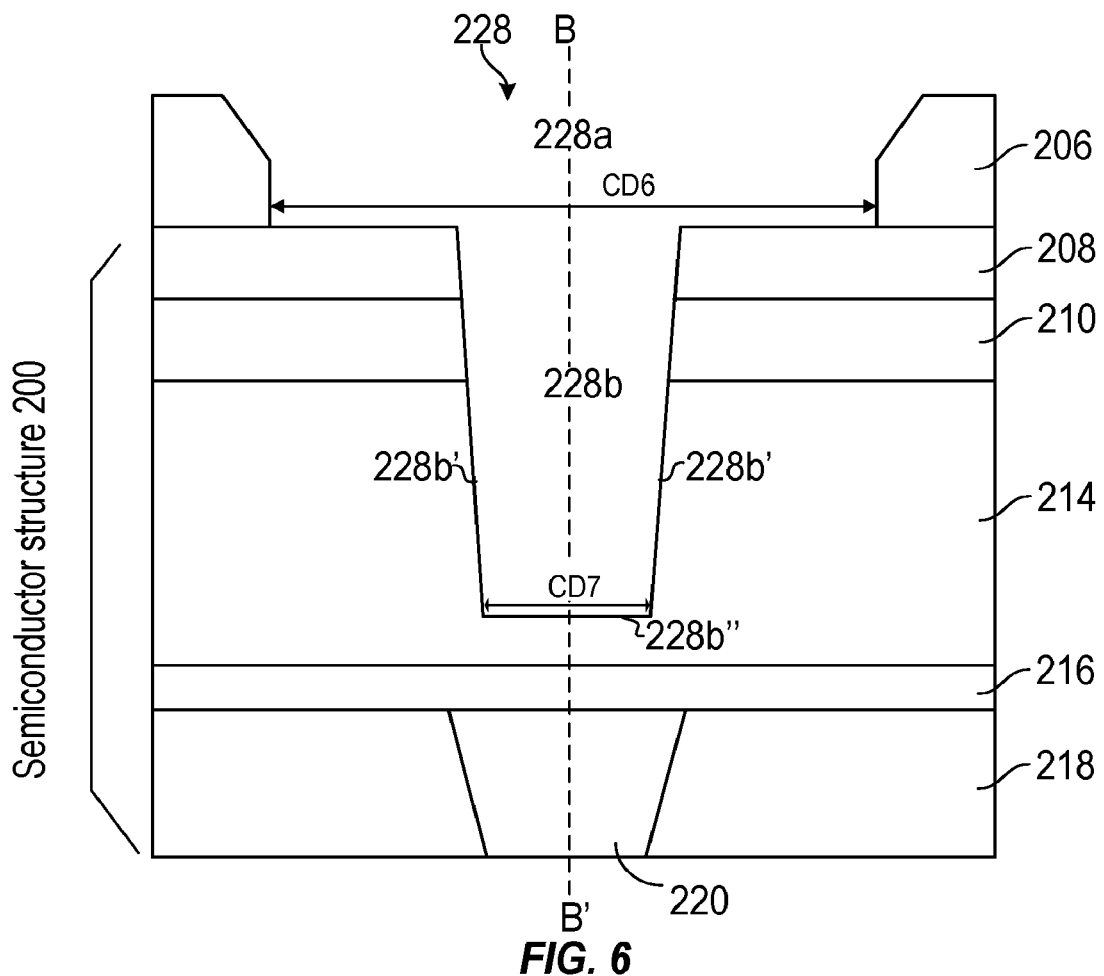

In FIG. 6, a second trim process step can be applied to recess the carbon layer 206 so as to form a fourth pattern 228. The fourth pattern 228 can have a fourth opening 228a form in the carbon layer 206 and a fifth opening 228b formed in the semiconductor structure 200. During the second trim process, the carbon layer 206 can be recess along the horizontal direction and the vertical direction. Accordingly, the top opening 227a shown in FIG. 5 can be expanded to form the fourth opening 228a due to the recess of the carbon layer 206 along the horizontal direction. After the second trim process, a portion of the fourth dielectric layer 208 can be exposed. In addition, the CD6 of the fourth opening 228a can be larger than the CD4 shown in FIG. 5.

In some embodiments, the recess of the carbon layer 206 along the vertical direction can reduce the thickness of the carbon layer 206. In some embodiments, the bottom opening 227b shown in FIG. 5 may not be impacted by the second trim process, and the fifth opening 228b can have a same dimension as the bottom opening 227b. In some embodiments, the fifth opening 228b can have a different dimension from the bottom opening 227b according to the trim process. For example, the fifth opening 228b can have a bottom CD7 that is larger than the bottom CD5 of the bottom opening 227b.

In some embodiments, the second trim process can be operated in similar process conditions to the first trim process. For example, the second trim process can be implemented through an oxygen plasma, a plasma generated by N2/O2 mixture gases, or other suitable plasmas.

Figure 7:
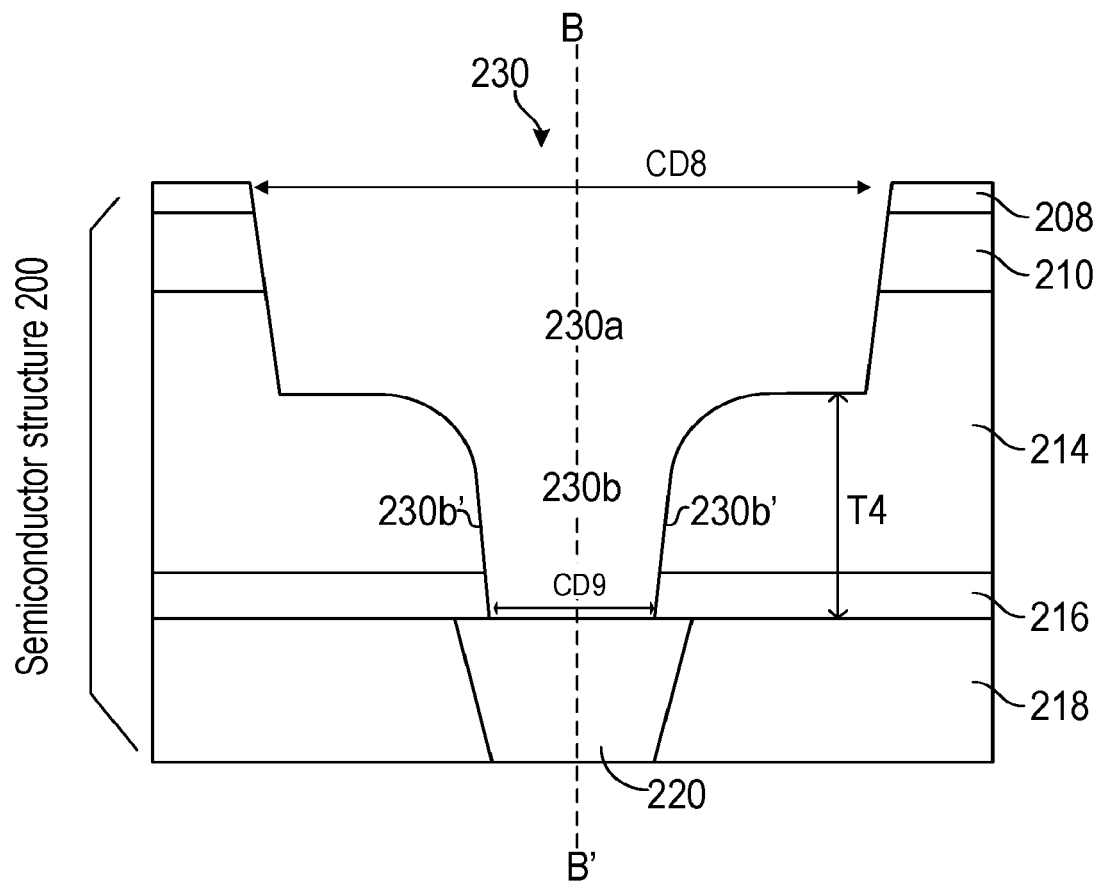

In FIG. 7, a second etching process can be applied according to the fourth pattern 228 to transfer the fourth pattern into the semiconductor structure 200 so as to form an interconnect opening (or dual damascene opening) 230. The interconnect opening 230 can include a trench opening 230a and a via opening 230b. During the second etching process, portions of the exposed area of the semiconductor structure 200 that are not covered by the carbon layer 206 can be removed to form the trench opening 230a with a top CD8. For example, as shown in FIG. 7, the second etching plasma can remove the exposed area of the fourth dielectric layer 208, the third dielectric layer 210, and also remove a part of exposed area of the second dielectric layer 214 to form the trench opening 230a. In addition, sidewalls 228b' and the bottom 228b" of the fifth opening 228b can be etched by the second etching process to form the via opening 230b that exposes the to-be-connected region 220 and has a bottom critical dimension CD9. After the second etching process, sidewalls 230b' of the via opening 230b can be located further away from the central axis B-B' than the sidewalls 228b" of the fifth opening 228b.

In some embodiments, the top CD8 of the trenching opening can be in a range from 200 nm to 400 nm. The bottom CD9 of the via opening can be in a range from 60 nm to 150 nm. A depth T4 of the via opening can be in a range between 1000 Å and 2000 Å. The second etching process can apply etching gases that include CF4, CHF4, CH2F2, Ar, N2, or other suitable etching gases. The second etching process can be operated at a temperature from 15° C. to 60° C., a pressure between 20 Torr and 80 Torr, a source power between 600 W and 1000 W, and a bias power between 0 W and 400 W. The second etching process can be an inductively coupled plasma (ICP) etching, a capacitively coupled plasma (CCP) etching, a reactive ion etching (RIE), or the like.

Figure 8:
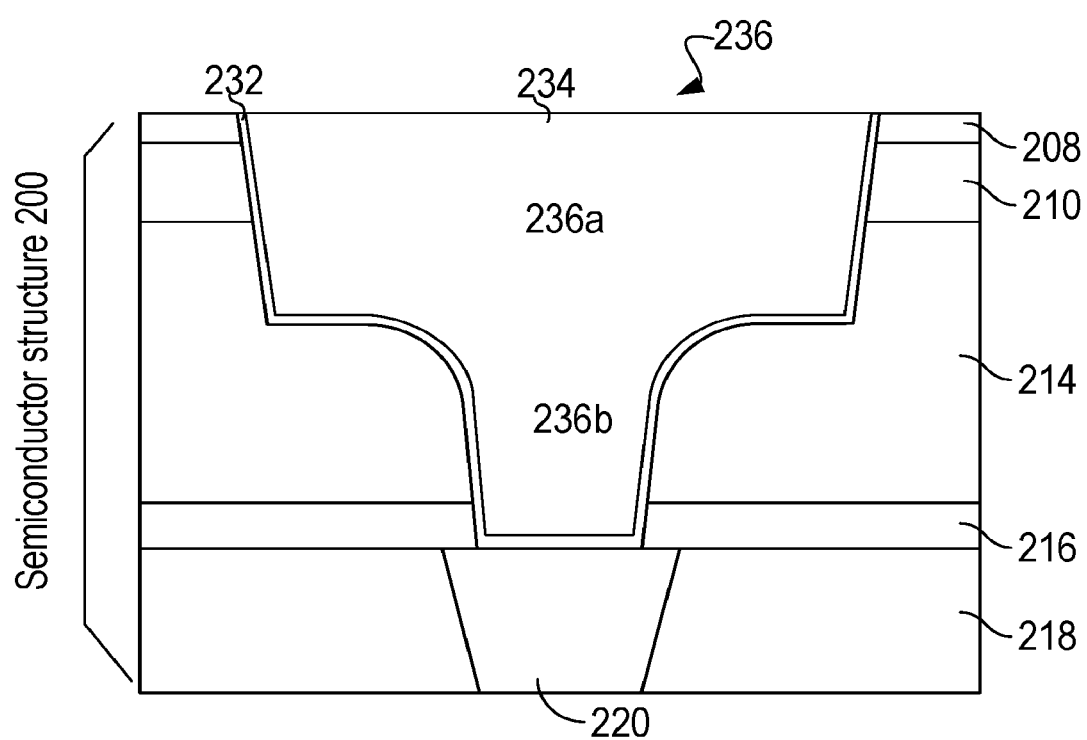

In FIG. 8, the interconnect opening 230 that is illustrated in FIG. 7 can subsequently be covered by a conductive barrier layer 232, such as a Ta layer, a TiN layer, a TaN, or the like, and then filled with a conductive layer 234, such as Cu, W, Ru, or the like, through a process, such as an electroplating process, a CVD process, a PVD process, a sputter process, or other suitable deposition processes. A surface planarization, such as a CMP process, can be applied to remove excessive conductive layer over the fourth dielectric layer 208 to form an interconnect structure 236.

FIG. 8 illustrates an exemplary interconnect structure 236 that is formed in the semiconductor structure 200. The interconnect structure 236 has a dual damascene structure that includes a conductive barrier layer 232, and a conductive layer 234. The conductive layer 234 fills the trench opening 230a to form a conductive trench 236a, and fills the via opening 230b to form a conductive via 236b. The interconnect structure 236 is electrically connected to the to-be-connected region 220 through the conductive via 236b.

Figure 9:
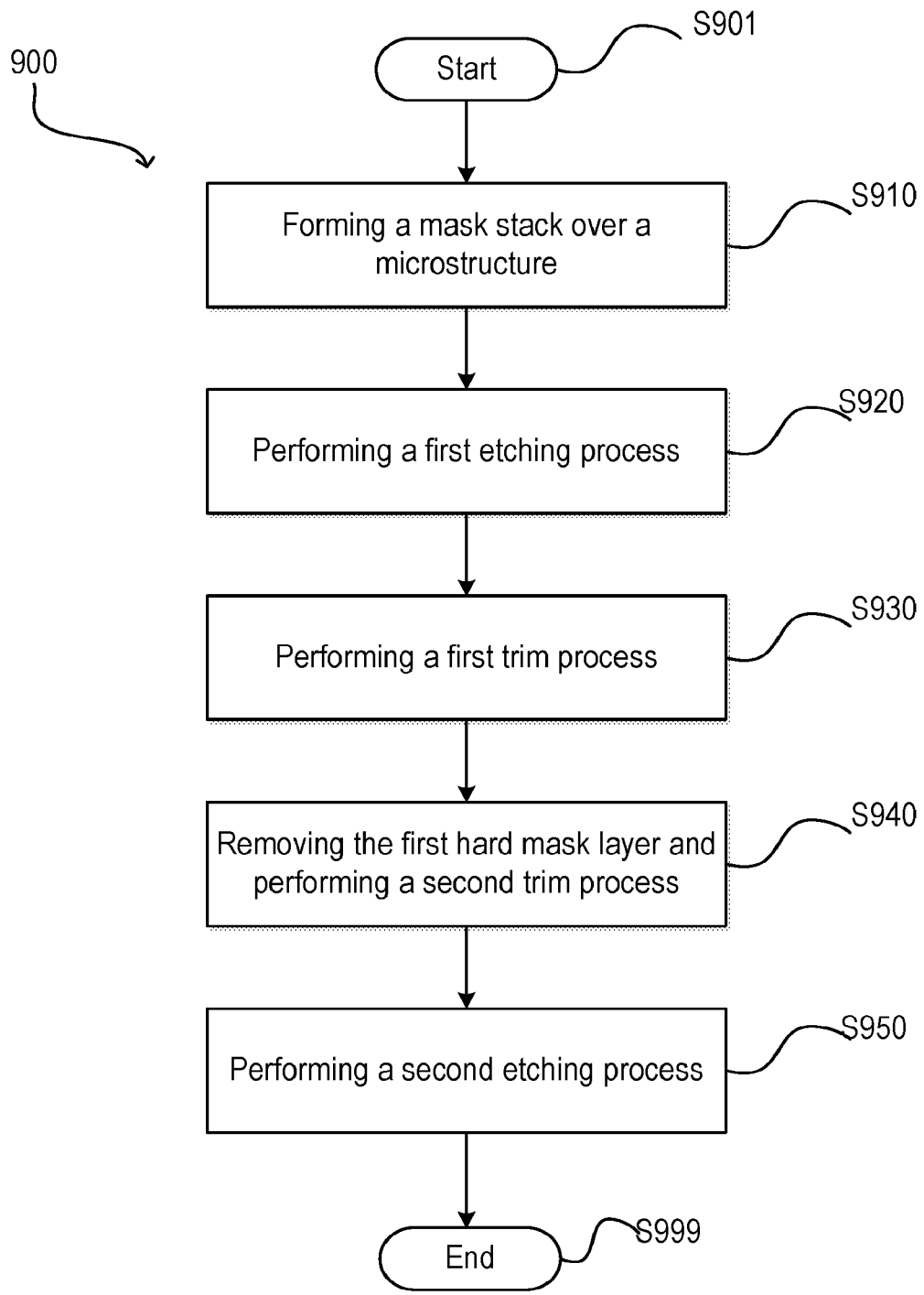
FIG. 9 is a flowchart of an exemplary process for manufacturing an interconnect structure, in accordance with embodiments of the disclosure.

FIG. 9 is a flowchart of an exemplary process 900 for manufacturing a 3D-NAND structure, in accordance with embodiments of the disclosure.

The process 900 begins at step 910 where a mask stack is formed over a semiconductor structure. As described above, the mask stack can include a first pattern formed in a resist layer, a first mask layer formed below the resist layer, and a second mask layer disposed between the first mask layer and the semiconductor structure. The semiconductor structure can include a to-be-connected region, and a barrier layer formed over the to-be-connected region, and a plurality of dielectric layers formed over the barrier layer. In some embodiments, the first mask layer can be a DARC layer, and the second mask layer can be a carbon layer. In some embodiments, step 910 can be performed as illustrated with reference to FIG. 2.

The process 900 then proceeds to step 920 where a first etching process can be applied. The first etching process can etch the semiconductor structure according to the first pattern to transfer the first pattern into the first mask layer, the second mask layer, and a portion of the semiconductor structure so as to form a second pattern. The second pattern has sidewalls and a bottom that extends into the semiconductor structure. In some embodiment, step 920 can be performed as illustrated with reference to FIG. 3.

In step 930 of the process 900, a first trim process is performed. The first trim process can remove the resist layer, and further recesses or undercut a portion of the second mask layer so as to form a third pattern. The third pattern includes a first opening formed in the first mask layer, a second opening formed in the second mask layer, and a third opening formed in the semiconductor structure. The first opening has first sidewalls, the second opening has second sidewalls, and the third opening has third sidewalls. The first, second, and third sidewalls of the respective openings are formed around a central axis, and the second sidewalls of the second opening are located further away from the central axis than both the first and third sidewalls of the first and third openings, respectively. In some embodiment, step 930 can be performed as illustrated with reference to FIG. 4.

The process 900 then proceeds to step 940 where the first mask layer is removed through a breakthrough process. The breakthrough process can be a plasma treatment in a short time period. Further, a second trim process can be applied to recess the second mask so as to form a fourth pattern. The fourth pattern includes a fourth opening formed in the second mask layer and a fifth opening extending into the semiconductor structure. In some embodiment, step 940 can be performed as illustrated with reference to FIGS. 5 and 6.

In step 950 of the process 900, a second etching process can be applied according to the fourth pattern to transfer the fourth pattern into the semiconductor structure so as to form an interconnect opening. The interconnect opening can include a trench opening and a via opening to exposed the to-be-connected region. Further, the interconnect opening can subsequently be covered by a conductive barrier layer, such as a Ta layer, and then filled in with a conductive layer, such as Cu, through an electroplating process. A surface planarization, such as a CMP process, can be applied to remove excessive conductive layer over a top surface of the semiconductor structure to form a interconnect structure in the semiconductor structure. In some embodiment, step 950 can be performed as illustrated with reference to FIGS. 7 and 8.

It should be noted that additional steps can be provided before, during, and after the process 900, and some of the steps described can be replaced, eliminated, or performed in different order for additional embodiments of the process 900. In subsequent process steps, various additional interconnect structures (e.g., metallization layers having conductive lines and/or vias) may be formed over the semiconductor structure 200. Such interconnect structures electrically connect the semiconductor structure 200 with other contact structures and/or active devices to form functional circuits. Additional device features such as passivation layers, input/output structures, and the like may also be formed.

The various embodiments described herein offer several advantages over related examples. For example, in order to form an interconnect structure that has a sufficient CD difference between a top CD associated with a trench opening and a bottom CD associated with a via opening of the interconnect structure, the related examples have process limitations, such as insufficient mask protection, or insufficient process window related to dry etch or photolithography. In the present disclosure, a first mask layer can be formed over a semiconductor structure, and a second mask layer can be disposed between the first mask layer and the semiconductor structure. A pattern can be formed that includes a first opening formed in the first mask layer, a second opening formed in the second mask layer, and a third opening formed in the semiconductor. A trim process can be applied to expand the second opening in the second mask layer by using a first mask layer as a protection layer. Accordingly, an expanded opening can be obtained in the second mask layer while a height of the second mask layer is retained due to the protection of the first mask layer. The expanded opening is subsequently transferred into the semiconductor structure to form a trench opening with a desired CD by applying an etching process. In addition, the retained height of the second mask layer can provide sufficient during the etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
    forming a mask stack over a semiconductor structure, the mask stack including a first mask layer and a second mask layer that is arranged between the first mask layer and the semiconductor structure; and
    patterning a first pattern in the mask stack that includes a first opening having first sidewalls formed in the first mask layer, a second opening having second sidewalls formed in the second mask layer, and a third opening having third sidewalls formed in the semiconductor structure, wherein:
    the first, second, and third sidewalls of the respective openings are formed around a central axis,
    the second sidewalls of the second opening are located further away from the central axis than both the first and third sidewalls of the first and third openings, respectively, and
    bottom portions of the second sidewalls of the second opening are located further away from the central axis than top portions of the third sidewalls of the third opening.

2. The method of claim 1, wherein the mask stack further includes a resist layer formed over the first mask layer and the patterning the first pattern in the mask stack further comprises:
    patterning a second pattern in the resist layer;
    performing a first etching process that transfers the second pattern into the first mask layer, the second mask layer, and the semiconductor structure and forms a third pattern that extends into the semiconductor structure; and
    performing a first trim process to remove the resist layer and a portion of the second mask layer, so as to form the second opening of the first pattern.

3. The method of claim 2, further comprising:
    removing the first mask layer and performing a second trim process to recess the second mask layer so as to form a fourth pattern, the fourth pattern including a fourth opening formed in the second mask layer and a fifth opening formed in the semiconductor structure; and
    performing a second etching process according to the fourth pattern to form an interconnect opening that includes a trench opening and a via opening.

4. The method of claim 3, further comprising:
    removing the first mask layer by an etching process that further etches the sidewalls of the second opening and the third opening.

5. The method of claim 1, wherein a critical dimension (CD) of the second opening is larger than a CD of the first opening and a CD of the third opening.

6. The method of claim 1, wherein the third opening has a tapered profile.

7. The method of claim 3, wherein a critical dimension of the fourth opening is larger than a critical dimension of the second opening after performing the second trim process to recess the second mask layer.

8. The method of claim 3, wherein the semiconductor structure further comprises a to-be-connected region that is disposed on the central axis, a barrier layer formed over the to-be-connected region, and a plurality of dielectric layers formed over the barrier layer.

9. The method of claim 8, wherein the performing the second etching process further comprises:
    etching an exposed area of the semiconductor structure which is not covered by the second mask layer to form the trench opening with a top critical dimension; and
    etching sidewalls and a bottom of the fifth opening to form the via opening that exposes the to-be-connected region and has a bottom critical dimension that is smaller than the top critical dimension.

10. A method for fabricating a semiconductor device, the method comprising:
    forming a mask stack over a semiconductor structure, the mask stack including a first pattern formed in a resist layer, a first mask layer formed below the resist layer, and a second mask layer disposed between the first mask layer and the semiconductor structure;

performing a first etching process, the first etching process etching the semiconductor structure according to the first pattern to transfer the first pattern into the first mask layer, the second mask layer, and the semiconductor structure so as to form a second pattern, the second pattern having sidewalls that extends into the semiconductor structure;

performing a first trim process, the first trim process removing the resist layer and a portion of the second mask layer to form a third pattern, wherein the third pattern has a first opening having first sidewalls formed in the first mask layer, a second opening having second sidewalls formed in the second mask layer, and a third opening having third sidewalls formed in the semiconductor structure, wherein the first, second, and third sidewalls of the respective openings are formed around a central axis and the second sidewalls of the second opening are located further away from the central axis than both the first and third sidewalls of the first and third openings, respectively;

removing the first mask layer and performing a second trim process to recess the second mask layer so as to form a fourth pattern, the fourth pattern including a fourth opening formed in the second mask layer and a fifth opening extending into the semiconductor structure; and performing a second etching process according to the fourth pattern to transfer the fourth pattern into the semiconductor structure so as to form an interconnect opening, the interconnect opening including a trench opening and an via opening.

11. The method of claim 10, wherein a critical dimension (CD) of the second opening is larger than a CD of the first opening and a CD of the third opening.

12. The method of claim 10, wherein a critical dimension (CD) of the fourth opening is larger than a CD of the fifth opening.

13. The method of claim 10, wherein a critical dimension of the fourth opening is larger than a critical dimension of the second opening after performing the second trim process to recess the second mask layer.

14. The method of claim 10, wherein the removing the first mask layer comprises:
removing the first mask layer by an etching process that further etches the sidewalls of the second opening and the third opening.

15. The method of claim 10, wherein the semiconductor structure comprises a to-be-connected region that is disposed on the central axis, a barrier layer formed over the to-be-connected region, and a plurality of dielectric layers formed over the barrier layer.

16. The method of claim 15, wherein the performing the second etching process further comprises:
etching an exposed area of the semiconductor structure which is not covered by the second mask layer to form the trench opening with a top critical dimension; and
etching sidewalls and a bottom of the fifth opening to form the via opening that exposes the to-be-connected region and has a bottom critical dimension that is smaller than the top critical dimension.

17. The method of claim 10, wherein the third opening has a tapered profile.

18. A method for fabricating a semiconductor device, the method comprising:
forming a semiconductor structure, the semiconductor structure including a to-be-connected region that is disposed on a central axis, a barrier layer formed over the to-be-connected region, and a plurality of dielectric layers formed over the barrier layer;
forming a mask stack over the semiconductor structure, the mask stack including a first mask layer and a second mask layer that is arranged between the first mask layer and the semiconductor structure; and
patterning a first pattern in the mask stack that includes a first opening having first sidewalls formed in the first mask layer, a second opening having second sidewalls formed in the second mask layer, and a third opening having third sidewalls formed in the plurality of the dielectric layer of the semiconductor structure and a bottom disposed over the barrier layer, wherein:
the first, second, and third sidewalls of the respective openings are arranged around the central axis,
a critical dimension of the second opening is greater than critical dimensions of both the first and third openings, respectively, and
bottom portions of the second sidewalls of the second opening are located further away from the central axis than top portions of the third sidewalls of the third opening.

19. The method of claim 18, wherein the mask stack further includes a resist layer formed over the first mask layer and the patterning the mask stack to form the first pattern further comprises:
patterning a second pattern in the resist layer;
performing a first etching process that transfers the second pattern into the first mask layer, the second mask layer, and the semiconductor structure and forms a third pattern that has sidewalls extending into the plurality of dielectric layers of the semiconductor structure and a bottom disposed over the barrier layer; and
performing a first trim process to remove the resist layer and a portion of the second mask layer, so as to form the second opening of the first pattern.

20. The method of claim 19, further comprising:
removing the first mask layer and performing a second trim process to recess the second mask layer so as to form a fourth pattern, the fourth pattern including a fourth opening formed in the second mask layer and a fifth opening formed in the semiconductor structure; and
performing a second etching process according to the fourth pattern to form an interconnect opening that includes a trench opening and a via opening, wherein the trench opening is formed in the plurality of dielectric layers, the via opening is disposed below the trench opening, and further exposes the to-be-connected region.

* * * * *